(12) United States Patent
Chang et al.

(10) Patent No.: US 7,304,728 B2
(45) Date of Patent: Dec. 4, 2007

(54) TEST DEVICE AND METHOD FOR LASER ALIGNMENT CALIBRATION

(75) Inventors: Shih-Tzung Chang, Vancouver, WA (US); Yu-Ku Lin, Hsin-Chu (TW); Shih-Ho Lin, Hsin-Chu (TW); Kei-Wei Chen, Taipei (TW); Ting-Chun Wang, Taoyuan (TW); Ching-Hwan Su, Hsin-Chu (TW); Ying-Lang Wang, Taichung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 332 days.

(21) Appl. No.: 10/942,554

(22) Filed: Sep. 15, 2004

(65) Prior Publication Data

US 2006/0055928 A1  Mar. 16, 2006

(51) Int. Cl.
*G01C 1/00* (2006.01)
(52) U.S. Cl. .................................. 356/141.3; 356/138
(58) Field of Classification Search ................ 356/138, 356/140, 142, 153, 141, 141.3
See application file for complete search history.

(56) References Cited

U.S. PATENT DOCUMENTS

| 3,633,285 | A | * | 1/1972 | Sensney | 434/22 |
|---|---|---|---|---|---|
| 3,778,169 | A | * | 12/1973 | Adams | 356/399 |
| 3,801,205 | A | * | 4/1974 | Eggenschwyler | 356/138 |
| 4,330,212 | A | * | 5/1982 | Miller | 356/508 |
| 6,473,980 | B2 | * | 11/2002 | Ripingill et al. | 33/506 |
| 6,807,740 | B2 | * | 10/2004 | Reed et al. | 33/286 |
| 2002/0009694 | A1 | * | 1/2002 | Rosa | 434/16 |
| 2002/0064761 | A1 | * | 5/2002 | Ripingill et al. | 434/19 |
| 2006/0042106 | A1 | * | 3/2006 | Smith et al. | 33/286 |

* cited by examiner

*Primary Examiner*—Roy M. Punnoose
(74) *Attorney, Agent, or Firm*—Tung & Associates

(57) ABSTRACT

A novel test device and method for calibrating the alignment of a laser beam emitted from a laser metrology tool with respect to a target area on a substrate. The test device includes a laser-sensitive material having a calibration pattern that includes a target point. When the tool is properly adjusted, the laser beam strikes the target point and is released to production. If the laser beam misses the target point, the tool is re-adjusted and re-tested until the laser beam strikes the target point.

13 Claims, 1 Drawing Sheet

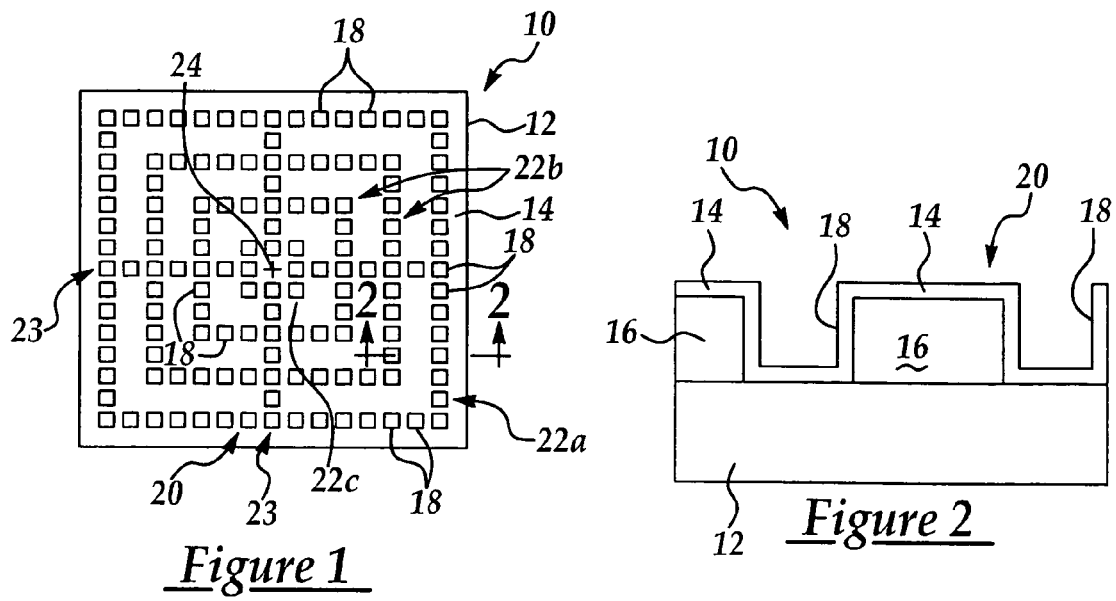
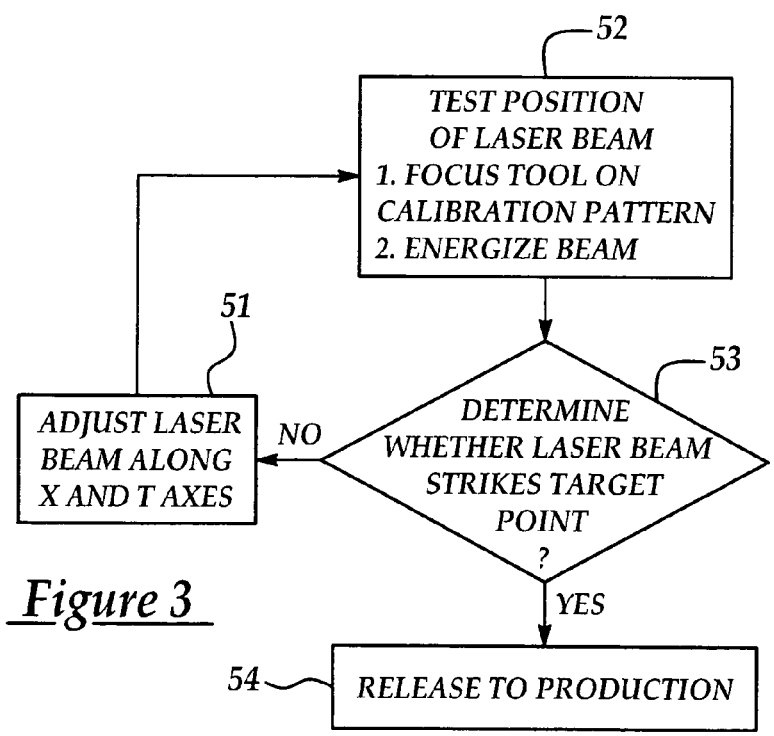
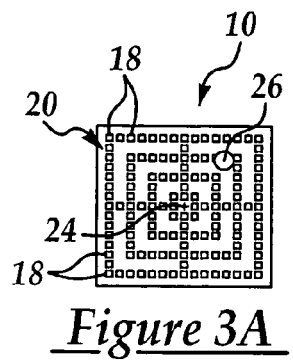
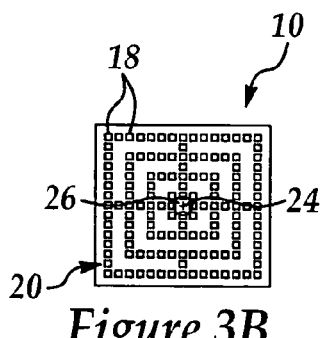
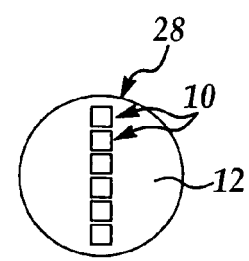

:

TEST DEVICE AND METHOD FOR LASER ALIGNMENT CALIBRATION

FIELD OF THE INVENTION

The present invention relates to high-powered lasers used to measure the thickness and other qualities of metal films on semiconductor wafer substrates in the fabrication of semiconductor integrated circuits. More particularly, the present invention relates to a device and method for calibrating and monitoring the alignment position of a laser beam used to test metal film thickness or other qualities on a wafer substrate.

BACKGROUND OF THE INVENTION

In the fabrication of semiconductor integrated circuits, metal conductor lines are used to interconnect the multiple components in device circuits on a semiconductor wafer. A general process used in the deposition of metal conductor line patterns on semiconductor wafers includes deposition of a conducting layer on the silicon wafer substrate; formation of a photoresist or other mask such as titanium oxide or silicon oxide, in the form of the desired metal conductor line pattern, using standard lithographic techniques; subjecting the wafer substrate to a dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers.

The ongoing advances in the field of fabricating miniaturized electronic integrated circuits (ICs) has involved the fabrication of multiple layers of interconnects, or the layers of separate electrical conductors which are formed on top of a substrate and connect various functional components of the substrate and other electrical connections to the IC. Electrical connections between the interconnect layers and the functional components on the substrate are achieved by via interconnects, which are post- or plug-like vertical connections between the conductors of the interconnect layers and the substrate. ICs often have five or more interconnect layers formed on top of the substrate.

Only a relatively short time ago, it was impossible or very difficult to construct an IC with more than one or two layers of interconnects. The topology variations created by forming multiple layers on top of one another resulted in such significant depth of focus problems with lithographic processes that any further additions of layers were nearly impossible to achieve. However, recent advances in semiconductor fabrication planarization techniques, such as chemical mechanical polishing (CMP), have been successful in smoothing relatively significant variations in the height or topography of each interconnect layer. As a result of the smoothing, or planarization, conventional lithographic processes are repetitively used without significant limitation to form considerably more layers of interconnects than had previously been possible.

Because the thickness of metal films deposited on substrates is important, testing of the metal film thicknesses is regularly carried out during semiconductor fabrication. One of the methods used to test the thickness of a metal film involves the use of a Rudolph Metapulse tool, which measures laser-induced sound wave pulses in the film to obtain film thickness. The tool directs the sound wave pulses against the metal film, and the pulses travel through the film to the metal film/insulative layer interface. Some of the sound wave pulses are reflected from the interface and emitted from the surface of the metal film, where they are detected by a sound detector. The time which elapses from impingement of the sound wave pulses against the metal film, to emission of the pulses from the film to the sound detector, is translated into thickness of the metal film.

Another method which is frequently used to measure the thickness of a metal film involves the use of a laser metrology tool to direct high-energy laser beam through a metal film deposited on a test wafer. However, one of the drawbacks associated with the laser metrology tool is the lack of a calibration method to ensure accurate impingement of the laser beam against the desired target area on the metal film. Furthermore, during the course of repeated use the laser beam is susceptible to baseline drifting. Accordingly, a device and method is needed to calibrate a laser metrology tool and prevent baseline drifting of a laser beam during repeated use of the tool.

An object of the present invention is to provide a test device and method for calibrating a laser metrology tool.

Another object of the present invention is to provide a test device and method for ensuring accurate impingement of a laser beam against a target.

Still another object of the present invention is to provide a test device and method which enables corrective adjustments to be made in the alignment of a laser beam with respect to a target area on a substrate.

Yet another object of the present invention is to provide a test device which is suitable for ensuring and maintaining alignment of a laser beam with respect to a target area on a substrate, which test device includes a substrate with a calibration pattern provided thereon.

A still further object of the present invention is to provide a novel test device and laser alignment calibration method which is suitable for aligning a laser beam with respect to a target area on a film to measure the thickness or other aspects or qualities of the film.

Yet another object of the present invention is to provide a test device and laser alignment calibration method which is suitable for use in a variety of industrial technologies, particularly semiconductor fabrication technology.

SUMMARY OF THE INVENTION

In accordance with these and other objects and advantages, the present invention is generally directed to a novel test device and method for calibrating the alignment of a laser beam emitted from a laser metrology tool with respect to a target area on a substrate. The test device includes a substrate on which is provided a laser-sensitive material that is easily damaged, ablated, melted, burned or otherwise changed in appearance by direct impingement of the laser beam thereon. A calibration pattern is provided on the laser-sensitive material and includes a target point which may be at the center of the calibration pattern and represents the desired alignment spot of the laser beam with respect to a target area on actual substrates to be measured.

According to the calibration method of the present invention, the laser-emitting apparatus of the laser metrology tool is initially adjusted along the X and Y axes to place the laser beam in the appropriate position for impingement of the laser beam against the target area on substrates to be measured. This position is tested by test-emitting the laser beam from the tool against the calibration pattern on the test device. In the event that the laser beam is aligned for accurate and precise impingement against the target area on an actual substrate to be measured, the laser beam will strike the target point on the calibration pattern. Accordingly, the laser metrology tool is suitably adjusted for the testing of actual substrates and is released to production.

In the event that the laser beam is misaligned with respect to the target area on actual substrates, the laser beam test-emitted from the laser metrology tool will miss the target point and strike an off-target area on the calibration pattern. The laser-sensitive material on the test device is damaged, ablated, melted, burned or otherwise changes in appearance to reveal the actual strike position of the laser beam with respect to the target point. Accordingly, the laser metrology tool is again adjusted to re-position the laser-emitting apparatus of the tool along the X-axis and/or the Y-axis in an attempt to obtain accurate impingement of the laser beam against the target point. The laser beam is again emitted from the tool and against the calibration pattern on the test device to determine whether the tool is calibrated for accurate and precise impingement of the laser beam against the target point on the test device, and thus, against the target area on actual substrates.

If the laser beam of the re-adjusted tool strikes the target point on the calibration pattern of the test device, the tool is correctly calibrated for the testing of actual substrates and is released to production. If the laser beam again strikes an off-target position on the calibration pattern, the laser metrology tool is again adjusted and tested until the laser beam strikes the target point on the calibration pattern. When the laser beam is correctly adjusted to strike the test point on the calibration pattern, the tool is released to production and used to test actual substrates.

As the laser metrology tool is repeatedly used typically to measure film thickness or other film qualities on multiple substrates, the laser-emitting apparatus may have a tendency toward gradual baseline drifting of the laser beam from the target area on the substrates. Accordingly, the test device may be used to periodically re-test and re-calibrate the laser metrology tool to maintain accurate and precise impingement of the laser beam emitted from the tool, against the test area on the substrates. This is accomplished by test-emitting the laser beam from the tool and against the calibration pattern on the test device and then re-adjusting the tool, as necessary, until the laser beam strikes the test point on the calibration pattern.

BRIEF DESCRIPTION OF THE DRAWINGS

The invention will be better understood, by way of example, with reference to the accompanying drawings, in which:

FIG. 1 is a top view of a test device according to the present invention;

FIG. 2 is a cross-sectional view, taken along section lines 2-2 in FIG. 1;

FIG. 3 is a flow chart illustrating typical steps according to the method for laser alignment calibration of the present invention;

FIG. 3A is a top view of a test device of the present invention, illustrating an off-center laser strike point on the calibration pattern of the device;

FIG. 3B is a top view of a test device of the present invention, illustrating a laser strike point at the target point on the calibration pattern of the device; and FIG. 4 is a top view of a semiconductor wafer on which is provided multiple test devices of the present invention.

DETAILED DESCRIPTION OF THE INVENTION

The present invention includes a novel test device and a method for calibrating the alignment of a laser beam emitted from a laser metrology tool with respect to a target area on a substrate, using the test device. The test device typically includes a substrate on which is provided a laser-sensitive material that is easily damaged, ablated, melted or burned, or otherwise changes appearance by direct impingement of the laser beam on the material. A calibration pattern is provided in the laser-sensitive material. A target point, which represents the desired alignment spot of the laser beam with respect to a target area on actual substrates to be measured, is provided in the center of the calibration pattern or in some other location on the calibration pattern.

In a typical embodiment, the test device includes a substrate on which is deposited a laser-sensitive material. The calibration pattern is defined by multiple pattern openings which extend into the laser-sensitive material and are typically arranged in multiple rows and columns. The rows and columns may be arranged in multiple, concentric rectangles which increase in size from the center to the edges of the calibration pattern. The pattern openings may further define a pair of intersecting target rows that extend through the rectangles, in which case the target point is located at the intersection of the target rows.

In a typical embodiment, a supporting layer, such as an oxide, is provided on the substrate, and the laser-sensitive material is provided on the supporting layer. The laser-sensitive material may be a laser-sensitive metal which is easily melted by direct impingement of the laser beam on the metal. Preferably, the laser-sensitive material is a laser-sensitive metal such as copper, aluminum or silver, for example. Most preferably, the laser-sensitive material is copper.

The calibration method of the present invention is carried out typically by initially adjusting the laser-emitting apparatus of the laser metrology tool along the X and Y axes to place the laser beam in the appropriate position for impingement of the laser beam against the target area on substrates to be measured. The laser-emitting position of the apparatus is then tested by test-emitting the laser beam from the tool against the calibration pattern on the test device. Accordingly, the laser beam will strike and damage the laser-sensitive material at the target point on the calibration pattern if the apparatus is correctly adjusted for accurate and precise impingement of the emitted laser beam against the target area on an actual substrate to be measured. In that case, the laser metrology tool is ready to be used, without further adjustment, to test actual substrates and is released to production.

In the event that the laser beam is not correctly aligned for accurate measurement of actual substrates, the laser beam test-emitted from the laser metrology tool will miss the target point and strike an off-target area on the calibration pattern of the test device. The laser strikes and damages the off-target laser-sensitive material on the test device to reveal the actual strike position of the laser beam with respect to the target point. Accordingly, the laser metrology tool is again adjusted to re-position the laser-emitting apparatus of the tool along the X-axis and/or the Y-axis in an attempt to obtain accurate impingement of the laser beam against the target point. The laser beam is again emitted from the re-adjusted tool and against the calibration pattern on the test device to determine whether the laser beam strikes the test point on the test device, and thus, whether the tool is calibrated for accurate and precise impingement of the laser beam against the target area on actual substrates. Impingement of the laser beam on the test point of the calibration pattern reveals that the tool is correctly calibrated for actual substrates.

The test device and laser alignment calibration method of the present invention may also be used to periodically re-test the laser metrology tool, and re-calibrate the tool, as necessary when the tool drifts from the original X,Y axis settings required for accurate and precise measurement of substrates. This is accomplished by periodically test-emitting the laser beam from the tool and against the calibration pattern on the test device and then re-adjusting the tool, as necessary, until the laser beam strikes the test point on the calibration pattern. Testing of actual substrates is then resumed.

Referring to FIGS. 1, 2 and 4, an illustrative embodiment of a test device according to the present invention is generally indicated by reference numeral 10. The test device 10 includes a substrate 12, such as silicon, on which is provided a calibration pattern 20. As shown in FIG. 4, the substrate 12 may be, for example, a silicon semiconductor wafer 28 on which is provided multiple test devices 10 of the present invention. Each test device 10 typically has a rectangular configuration, with a length and width of typically about 300 µm.

As shown in FIG. 1, the calibration pattern 20 is defined by multiple pattern openings 18 that extend into a layer 14 of laser-sensitive material that is provided on the substrate 12, as will be hereinafter further described. In a preferred embodiment, the pattern openings 18 may define an outer rectangle 22a, at least one middle rectangle 22b and an inner rectangle 22c which are typically arranged in concentric relationship to each other. Additional pattern openings 18 may be further arranged in a pair of perpendicular target rows 23 which extend through the outer rectangle 22a, the middle rectangle or rectangles 22b and the inner rectangle 22c and intersect each other typically at the middle of the calibration pattern 20. Accordingly, a target point 24, framed by the inner rectangle 22c, is defined at the intersection of the target rows 23.

As shown in the cross-section of FIG. 2, the test device 10 includes a supporting layer 16, such as an oxide, for example. The pattern openings 18 extend through the supporting layer 16, typically to the substrate 12. Each pattern opening 18 has a width of typically about 10 µm. The laser-sensitive material layer 14 is provided on the supporting layer 16. Accordingly, the laser-sensitive material 14 is typically a continuous sheet or layer, lining the upper surface of the supporting layer 16 and the side and bottom surfaces of each pattern opening 18. Preferably, the laser-sensitive material 14 has a thickness of about 50~70 angstroms.

The test device 10 may be fabricated on the substrate 12 using a single-damascene process. Accordingly, the supporting layer 16 is initially deposited on the substrate 12, typically using conventional CVD or PVD techniques. Next, the supporting layer 16 is typically patterned with photoresist (not shown), and the pattern openings 18 are etched through the supporting layer 16, to the substrate 12. After stripping of the photoresist from the supporting layer 16, the laser-sensitive material 14 is deposited as a continuous layer on the supporting layer 16 and on the sidewalls and bottom of the pattern openings 18, typically using conventional CVD or PVD techniques.

It will be appreciated by those skilled in the art that the laser-sensitive material 14 may be any type of material which is capable of being damaged or which changes in appearance upon being contacted by a laser beam. Preferably, the laser-sensitive material 14 is a metal having a relatively low melting point, such as copper, aluminum or silver. Most preferably, the laser-sensitive material 14 is copper.

Referring next to FIGS. 3, 3A and 3B, according to the laser alignment calibration method of the present invention, the test device 10 is used to calibrate the position of a laser beam, emitted from a laser metrology tool (not shown), with respect to a target area on an actual substrate (not shown) to be tested using the laser beam. The method of the invention is applicable to high-powered (>3,000 W) laser metrology tools used to test the thickness or other qualities or aspects of films on a semiconductor wafer substrate. Typically, the semiconductor wafer substrate to be tested includes a metal layer the thickness of which is to be determined using the laser beam.

As indicated in step S1 of the flow diagram of FIG. 3, the laser-emitting apparatus (not shown) of the laser metrology tool (not shown) is initially adjusted along the X and Y axes to position the laser-emitting apparatus such that the laser beam emitted therefrom will strike the desired target area on an actual wafer substrate having the metal or other layer to be tested. This is adjustment is accomplished typically by entering coordinate positions for the desired target area on the substrate into the control system of the laser. The control system automatically adjusts the laser-emitting apparatus to the programmed coordinate positions.

As indicated in step S2 of FIG. 3, the position of the laser beam emitted from the tool is tested. This is facilitated by focusing the laser-emitting apparatus of the tool onto the calibration pattern 20 of the test device 10. Next, the laser beam is emitted from the laser metrology tool and strikes the test device 10 at some location on the calibration pattern 20.

As indicated in step S3 of FIG. 3, a determination is then made as to whether the laser beam emitted from the tool impinged on the test device 10 at the target point 24 or at some other location on the calibration pattern 20. If the emitted laser beam impinged on the test device 10 at the target point 24, as shown in FIG. 3B, then the laser-sensitive material 14 is damaged, melted, ablated or otherwise changes appearance at the target point 24, as revealed by a laser spot 26 on the laser-sensitive material 14. In that case, the laser metrology tool is properly calibrated for accurate and precise measurement of films on actual substrates (not shown) and is used for that purpose and released to production without further adjustment, as indicated in step S4.

As further indicated in step S3 of FIG. 3, if the laser beam emitted from the laser metrology tool in step S2 impinged on the test device 10 at some location other than the target point 24, as shown in FIG. 3A, then the laser-sensitive material 14 is damaged, melted, ablated or otherwise changed in appearance and forms a laser spot 26 wherever the laser beam impinged on the laser-sensitive material 14 on the calibration pattern 20. In that case, step S1 is repeated and the tool is re-adjusted along the X-axis and/or Y-axis in an attempt to more precisely position the strike point of the laser beam with respect to the target point 24 on the test device 10, and thus, the target area on the actual wafer substrates to be tested. After such adjustment is completed, step S2 is repeated and the laser beam again impinges on the test device 10.

In the event that the laser beam of the re-adjusted tool strikes the target point 24 on the calibration pattern 20, a visible laser spot 26 is formed on the laser-sensitive material 14, as shown in FIG. 3B. The tool is therefore correctly positioned for use and is used to test actual wafers, as indicated in step S4. In the event that the laser beam strikes and forms a laser spot 26 at an off-center location on the calibration pattern 20, however, as shown in FIG. 3A, steps S1-S3 are again repeated until the tool is correctly positioned for accurate and precise measurement of the actual wafer substrates.

Throughout repeated use of the laser metrology tool, the laser-emitting apparatus of the tool frequently drifts gradually from the settings which were achieved using the method of FIG. 3. Consequently, the strike point of the laser beam drifts from the target area on the substrates being measured. In that case, the test device 10 is used to periodically re-test and re-calibrate the laser metrology tool to maintain accurate and precise impingement of the laser beam emitted from the tool, against the test area on the substrates. This is carried out by test-emitting the laser beam from the tool and against the calibration pattern 20 on the test device 10 and then re-adjusting the tool, as necessary, until the laser beam strikes the test point 24 on the calibration pattern 20.

While the preferred embodiments of the invention have been described above, it will be recognized and understood that various modifications can be made in the invention and the appended claims are intended to cover all such modifications which may fall within the spirit and scope of the invention.

What is claimed is:

1. A test device for calibrating a laser metrology tool, comprising:
   a substrate;
   a laser-sensitive material provided on said substrate; and
   a calibration pattern having a target point provided on said laser-sensitive material.

2. The test device of claim 1 wherein said laser-sensitive material comprises a laser-sensitive metal.

3. The device of claim 2 wherein said laser-sensitive metal is a metal selected from the group consisting of copper, aluminum and silver.

4. The device of claim 3 wherein said calibration pattern comprises a plurality of pattern openings.

5. The device of claim 3 wherein said calibration pattern comprises a plurality of concentric rectangles.

6. The device of claim 5 wherein said calibration pattern comprises a plurality of pattern openings.

7. The test device of claim 1 wherein said calibration pattern comprises a plurality of pattern openings.

8. The test device of claim 7 wherein said laser-sensitive material comprises a laser-sensitive metal.

9. The test device of claim 1 wherein said calibration pattern comprises a plurality of concentric rectangles.

10. The test device of claim 9 wherein said laser-sensitive material comprises a laser-sensitive metal.

11. The device of claim 9 wherein said calibration pattern comprises a plurality of pattern openings.

12. The device of claim 11 wherein said laser-sensitive material comprises a laser-sensitive metal.

13. A method of calibrating a laser metrology tool, comprising the steps of:
    providing a test device comprising a laser-sensitive material and a calibration pattern having a target point provided on said laser-sensitive material;
    emitting a laser beam from the tool onto said calibration pattern;
    determining whether said laser beam strikes said target point; and
    adjusting said tool when said laser beam misses said target point.

* * * * *